(12) United States Patent
Fujioka

(10) Patent No.: US 9,135,983 B2
(45) Date of Patent: Sep. 15, 2015

(54) SEMICONDUCTOR MEMORY DEVICE AND CONTROL METHOD THEREOF

(71) Applicant: FUJITSU SEMICONDUCTOR LIMITED, Yokohama-shi, Kanagawa (JP)

(72) Inventor: Shinya Fujioka, Kawasaki (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/595,861

(22) Filed: Jan. 13, 2015

(65) Prior Publication Data

US 2015/0235690 A1 Aug. 20, 2015

(30) Foreign Application Priority Data

Feb. 14, 2014 (JP) .................................. 2014-026643

(51) Int. Cl.
*G11C 11/409* (2006.01)
*G11C 11/22* (2006.01)
*G11C 11/406* (2006.01)

(52) U.S. Cl.
CPC ............ *G11C 11/409* (2013.01); *G11C 11/221* (2013.01); *G11C 11/406* (2013.01)

(58) Field of Classification Search
CPC ... G11C 11/406; G11C 11/409; G11C 11/221
See application file for complete search history.

(56) References Cited

U.S. PATENT DOCUMENTS

| | | | | |
|---|---|---|---|---|
| 6,646,942 B2* | 11/2003 | Janzen | ........................ | 365/222 |
| 6,856,534 B2* | 2/2005 | Rodriguez et al. | ............ | 365/145 |
| 7,362,143 B2* | 4/2008 | O'Keeffe | ......................... | 327/77 |
| RE43,223 E * | 3/2012 | Stimak et al. | ................. | 365/222 |
| 8,588,017 B2* | 11/2013 | Park et al. | ..................... | 365/200 |
| 2005/0251618 A1 | 11/2005 | Nonaka et al. | | |
| 2014/0146624 A1* | 5/2014 | Son et al. | ..................... | 365/200 |

FOREIGN PATENT DOCUMENTS

| | | |
|---|---|---|
| JP | 08-063405 A | 3/1996 |
| JP | 2005-322293 A | 11/2005 |
| JP | 2010-009165 A | 1/2010 |
| JP | 2011-204026 A | 10/2011 |

* cited by examiner

*Primary Examiner* — Harry W Byrne
*Assistant Examiner* — Lance Reidlinger
(74) *Attorney, Agent, or Firm* — Arent Fox LLP

(57) ABSTRACT

When a voltage monitoring circuit detects that a supplied voltage is in a state of being less than a certain voltage at a time of performing writing of data with respect to a memory cell of a memory core having a refresh function, a flag is set in a register circuit, an address at which the writing is performed is held, and the memory core is made to execute rewriting by a refresh operation with respect to the held address, in accordance with the flag set in the register circuit, thereby enabling an increase in speed of operation while securing a retention life of memory data, and enabling a reduction in power consumption without lowering a processing capability even if the supplied voltage is lowered.

8 Claims, 9 Drawing Sheets

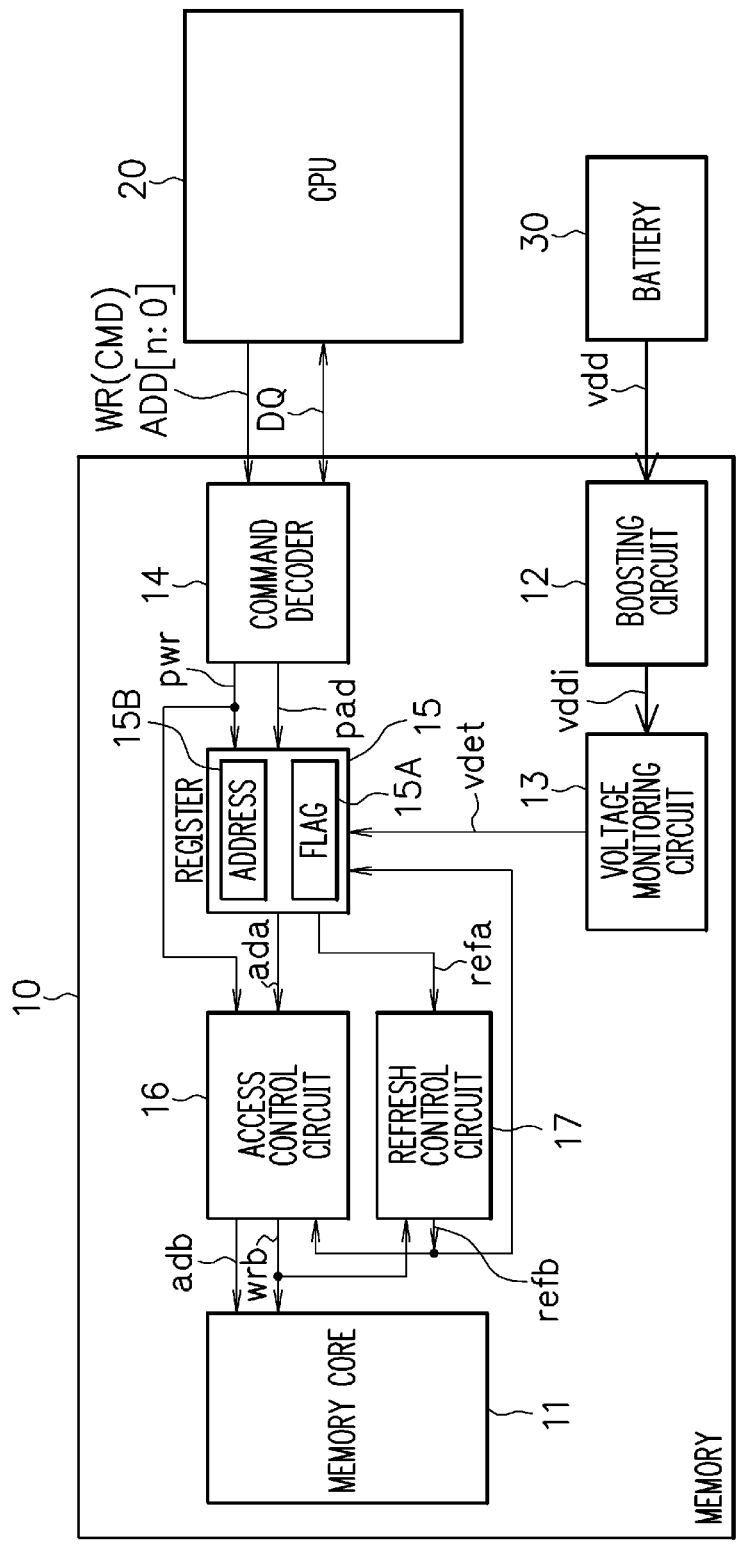

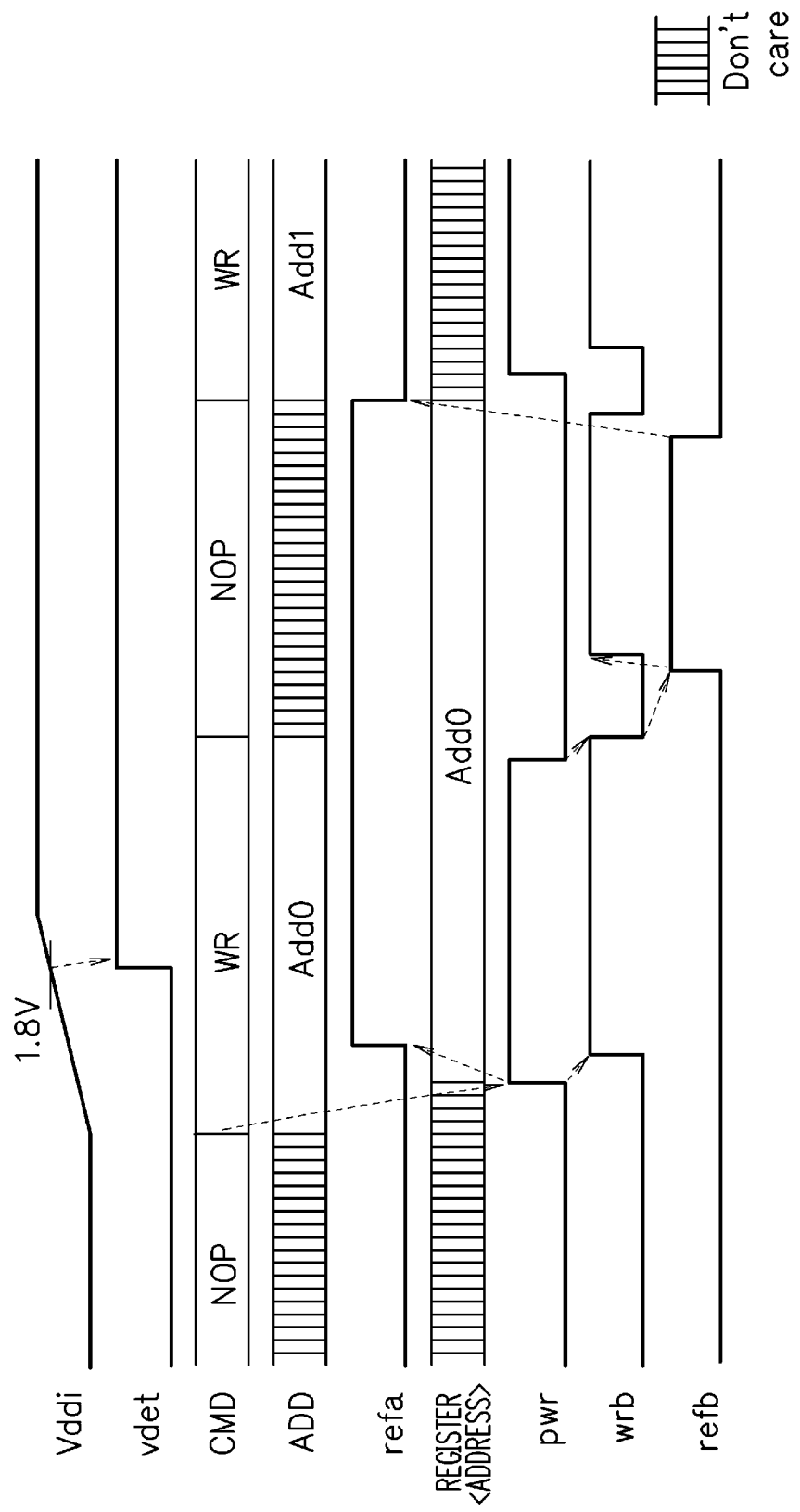

SEMICONDUCTOR MEMORY DEVICE AND CONTROL METHOD THEREOF

CROSS-REFERENCE TO RELATED APPLICATION

This application is based upon and claims the benefit of priority of the prior Japanese Patent Application No. 2014-026643, filed on Feb. 14, 2014, the entire contents of which are incorporated herein by reference.

FIELD

The embodiments discussed herein are directed to a semiconductor memory device and a control method thereof.

BACKGROUND

Regarding a system driven by a battery such as a mobile device, since a battery life becomes longer as a minimum operating voltage of a circuit such as LSI (Large Scale Integration) is reduced, it is demanded by a system designer to drive the circuit at a low voltage. A memory LSI (memory circuit) is also demanded to be driven at a low voltage, and it is preferably to improve an operation margin. When a driving voltage of a processor such as a CPU (Central Processing Unit) being a digital circuit and a driving voltage of a memory LSI having a large number of analog circuits are compared, the memory LSI has a low operation margin at a low voltage since it is difficult to lower an operating voltage of the analog circuit mounted on an inside of a chip.

For example, in a case of a destructive read-type memory circuit such as FeRAM (Ferro-electric Random Access Memory) and DRAM (Dynamic Random Access Memory), a deterioration of retention property or the like of memory data is caused as follows. In the case of FeRAM, a hysteresis loop of a cell capacitor is rotated to perform reading of data and storage and writing of data, and under an operating environment at a low voltage, an amount of polarization becomes small as illustrated in FIG. 11A, and a difference of amount of polarization between 0 data and 1 data becomes small, resulting in that a read margin is deteriorated and a data retention life is shortened. In the case of DRAM, under an operating environment at a low voltage, an amount of electric charge accumulated in a cell capacitor is reduced as illustrated in FIG. 11B, resulting in that a read margin is deteriorated and a data retention life is shortened.

Although there is a method of lowering a threshold value of a transistor for lowering an operating voltage of an analog circuit, when the threshold value of the transistor is lowered, a leak current under an off state is increased, which increases a standby current, and thus the method is not suitable for a system driven by a battery. Other than the above, there is a method in which a boosting circuit is built in a memory LSI, as illustrated in FIG. 12, and a control is performed so that a supplied voltage does not become a voltage less than a certain voltage.

In FIG. 12, a memory circuit 401 performs storage and reading of memory data in accordance with an access request from a CPU 402. A battery 403 supplies an operating voltage to the memory circuit 401 and the CPU 402. An output of the battery 403 is 0.9 V to 1.5 V, for example, and the CPU 402 can be driven at this operating voltage. On the other hand, the operating voltage of the memory circuit 401 is 1.8 V to 3.0 V, for example, and has a high voltage level, compared to the operating voltage of the CPU 402. The memory circuit 401 uses, as the operating voltage, a voltage obtained by performing boosting with the use of a boosting circuit 404 so that the voltage level is doubled, for example. In the system illustrated in FIG. 12, there is no relation between a control of the boosting circuit 404 and a memory access from the CPU 402, so that there is a need to constantly drive the boosting circuit 404, which becomes a main cause of hindering a low power consumption.

There has been proposed a technique in which, in a system having a memory circuit, when a power supply voltage supplied to the memory circuit is lowered, an address or the like at which writing is stopped is stored to stop an operation, and after the power supply is returned, the writing is started again from the address at which the writing is stopped (refer to Patent Documents 1 to 4, for example). In the conventional system having the memory circuit as illustrated in FIG. 12, even if the power supply voltage supplied to the memory circuit is lowered, the constant driving of the boosting circuit becomes the main cause of hindering the low power consumption, resulting in that a battery life is shortened.

Patent Document 1: Japanese Laid-open Patent Publication No. 2010-9165

Patent Document 2: Japanese Laid-open Patent Publication No. 2011-204026

Patent Document 3: Japanese Laid-open Patent Publication No. 08-63405

Patent Document 4: Japanese Laid-open Patent Publication No. 2005-322293

SUMMARY

One aspect of a semiconductor memory device includes: a voltage monitoring circuit which monitors a supplied voltage; a memory core which includes a plurality of memory cells and includes a refresh function; a register circuit in which a flag is set when it is detected that the supplied voltage is in a state of being less than a certain voltage at a time of performing writing of data with respect to a memory cell of the plurality of the memory cells, and which holds an address at which the writing is performed; and a control circuit which makes, in accordance with the flag set in the register circuit, the memory core execute rewriting by a refresh operation with respect to the held address.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram illustrating a configuration example of a semiconductor memory device in a first embodiment;

FIG. 5 is a timing chart illustrating an operation example of the semiconductor memory device in the first embodiment;

DESCRIPTION OF EMBODIMENTS

Hereinafter, embodiments will be described based on the drawings.

Figure 12:
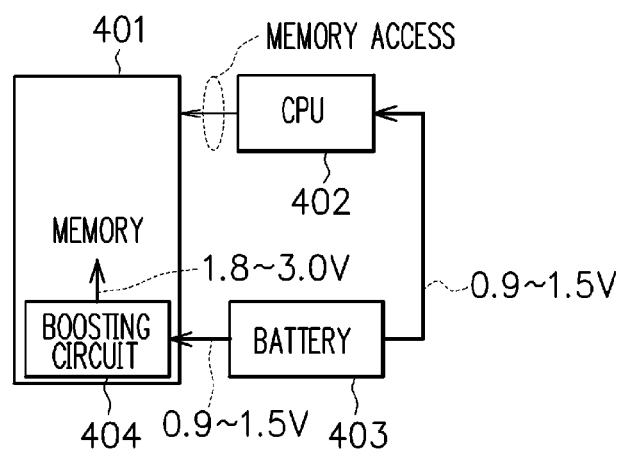
FIG. 12 is a diagram illustrating an example of a conventional memory system having a boosting circuit.

In the system such as one illustrated in FIG. 12 described above, there is no relation between the control of the boosting circuit in the memory circuit and the memory access from the CPU, so that there is a need to constantly drive the boosting circuit, which becomes a main cause of hindering the low power consumption. On the contrary, there is a method in which a CPU controls a driving timing of a boosting circuit in a manner such that, normally, the boosting circuit is not driven, and the boosting circuit is driven when a memory access is conducted, thereby realizing a low power consumption.

However, in this method, it makes the memory access wait from when the CPU starts driving the boosting circuit to when the voltage at which the memory circuit becomes operational can be obtained. Therefore, although it is possible to reduce a current during a period in which the memory access is not conducted, a period of time up to when the memory access is conducted becomes long, resulting in that a processing capability of the system is deteriorated. In the embodiments to be described hereinafter, it becomes possible to reduce a power consumption without lowering the processing capability of the system.

First Embodiment

A first embodiment will be described.

FIG. 1 is a diagram illustrating a configuration example of a semiconductor memory device in the first embodiment. As illustrated in FIG. 1, a memory circuit 10 as a semiconductor memory device in the first embodiment includes a memory core 11, a boosting circuit 12, a voltage monitoring circuit 13, a command decoder 14, a register circuit 15, an access control circuit 16, and a refresh control circuit 17.

The memory core 11 has a plurality of memory cells each storing data. For example, each of the memory cells is a memory cell such as FeRAM (Ferro-electric Random Access Memory) and DRAM (Dynamic Random Access Memory) having a cell capacitor. The memory core 11 has a refresh function. That is, the memory core 11 has a function of reading, from the memory cell, data to a data line such as a bit line, and writing the read data into the memory cell.

The boosting circuit 12 boosts a power supply voltage Vdd (0.9 V to 1.5 V, for example) supplied from a battery 30 to generate a voltage at which the memory core 11 can operate, and outputs a voltage Vddi (1.8 V to 3.0 V, for example) to an inside of the memory circuit 10. The voltage monitoring circuit 13 monitors the voltage Vddi of the power supply supplied from the boosting circuit 12, and outputs a signal vdet in accordance with the voltage Vddi. When the voltage Vddi of the power supply supplied from the boosting circuit 12 is less than a certain voltage (a voltage required for the operation of the memory core 11), the voltage monitoring circuit 13 negates the signal vdet, and when the voltage Vddi is not less than the certain voltage, the voltage monitoring circuit 13 asserts the signal vdet.

Figure 2A:
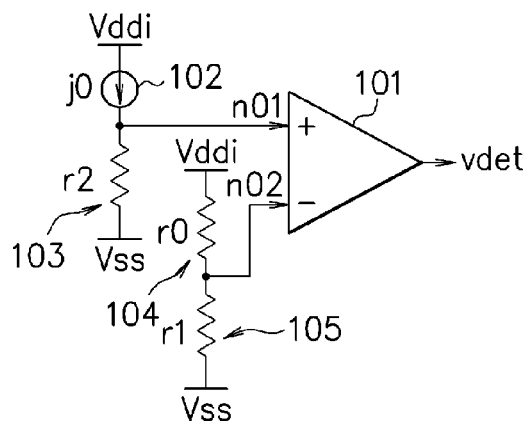
FIG. 2A is a diagram illustrating a configuration example of a voltage monitoring circuit in the present embodiment.

FIG. 2A is a diagram illustrating a configuration example of the voltage monitoring circuit 13. An electric potential of a connection point between a current source 102 and a resistor 103, the current source 102 and the resistor 103 being connected between the voltage Vddi and a reference potential Vss, is input into a first input node (positive-side input end) n01 of a comparator 101. An electric potential of a connection point between a resistor 104 and a resistor 105, the resistor 104 and the resistor 105 being connected between the voltage Vddi and the reference potential Vss, is input into a second input node (negative-side input end) n02 of the comparator 101.

Figure 2B:
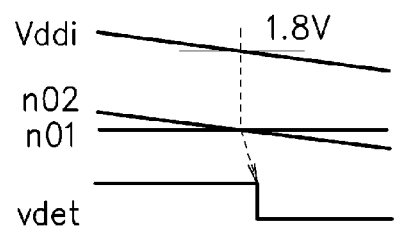
FIG. 2B is a diagram illustrating an operation example of the voltage monitoring circuit in the present embodiment.

If an output current output by the current source 102 is set to j0, a resistance value of the resistor 103 is set to r2, and resistance values of the resistors 104 and 105 are set to r0 and r1, respectively, when a value of (j0×r2) is less than a value of r1×Vddi/(r0+r1), the voltage monitoring circuit 13 negates the signal vdet to a low level. In the present embodiment, it is designed such that the voltage monitoring circuit 13 appropriately adjusts the output current j0, and the resistance values r0, r1, and r2, thereby negating the signal vdet to a low level when the voltage Vddi is less than 1.8V, and asserting the signal vdet to a high level when the voltage Vddi is not less than 1.8 V, as illustrated in FIG. 2B.

The command decoder 14 decodes a signal related to an access request from a CPU 20, and outputs a signal in accordance with a result of the decoding. The command decoder 14 inputs, for example, a write signal WR (CMD) and an address signal ADD [n:0] supplied from the CPU 20 therein, and performs input and output of data signal DQ with the CPU 20. When the write signal WR (CMD) is input into the command decoder 14 from the CPU 20, the command decoder 14 outputs a write signal pwr, and outputs an address of the signal as an address signal pad. Note that the CPU 20 controls not-illustrated respective functional units (respective circuits) of the system including the memory circuit 10 in the present embodiment.

The register circuit 15 includes two storage areas of a flag register 15A and an address register 15B, and stores that writing is performed under a condition where the voltage Vddi of the power supply supplied from the boosting circuit 12 is less than the certain voltage. The flag register 15A stores that the writing is performed under the condition where the voltage Vddi is less than the certain voltage, and the address register 15B stores an address pad when the writing is performed under the condition where the voltage Vddi is less than the certain voltage. These operations are conducted based on the signal vdet output from the voltage monitoring circuit 13. The register circuit 15 invalidates the stored information in accordance with a signal refb output from the refresh control circuit 17.

Figure 3A:
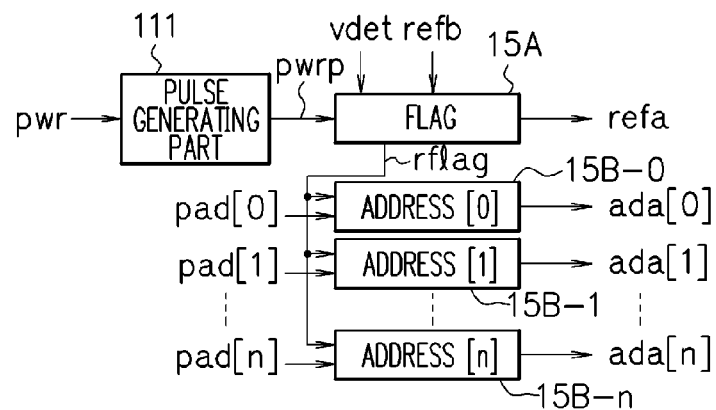
FIG. 3A is a diagram illustrating a configuration example of a register circuit in the present embodiment.

FIG. 3A is a diagram illustrating a configuration example of the register circuit 15. A pulse generating part 111 asserts, when the signal pwr output from the command decoder 14 is asserted, a signal pwrp in a pulse form. The flag register 15A sets a refresh flag when the signal vdet is negated under the state where the signal pwrp is asserted, and it resets the refresh flag when the signal refb is asserted and then is negated. When the refresh flag is set, the flag register 15A asserts signals refa and rflag.

Each of address registers 15B-0 to 15B-n holds an address signal pad [i] (i=0 to n) output from the command decoder 14, in accordance with the signal rflag. When the signal rflag is asserted, the address register 15B outputs and holds the address signal pad [i] as an address signal ada [i]. When the signal rflag is negated, the address register 15B outputs the address signal pad [i] as the address signal ada [i].

Figure 3B:
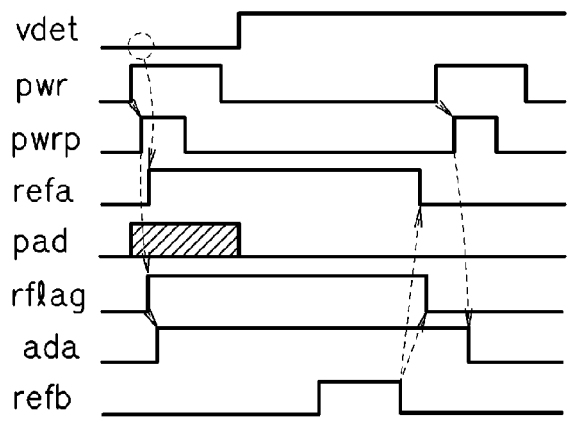
FIG. 3B is a diagram illustrating an operation example of the register circuit in the present embodiment.

When the signal pwr is asserted under the state where the signal vdet is negated as illustrated in FIG. 3B, the register circuit 15 sets the refresh flag in the flag register 15A, and asserts the signals refa and rflag. Further, since the signal rflag is asserted, the address signal pad is held as the address signal ada in the address register 15B. When the signal refb is negated, the signals refa and rflag are negated.

Figure 4A:
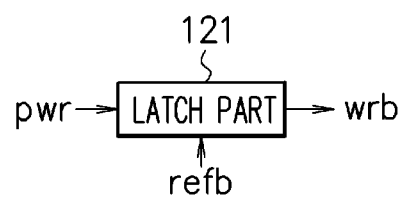
FIG. 4A and FIG. 4B are diagrams illustrating an example of an access control circuit in the present embodiment.
Figure 4B:
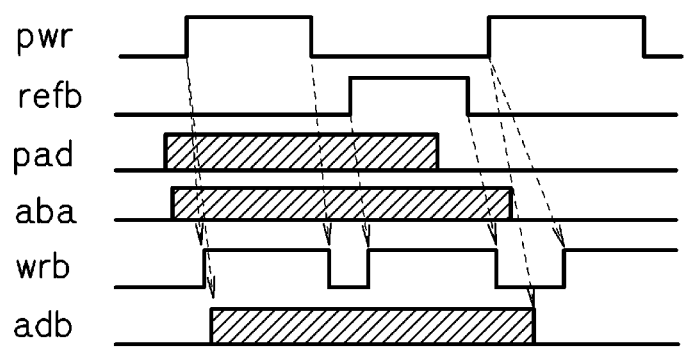

The access control circuit 16 performs a control of access with respect to the memory core 11. The access control circuit 16 performs access with respect to the memory core 11 in accordance with, for example, the signal pwr from the command decoder 14, and the signal refb from the refresh control circuit 17. The access control circuit 16 includes a latch part 121 as illustrated in FIG. 4A. When the signal pwr or the signal refb is asserted as illustrated in FIG. 4B, the access control circuit 16 latches the signal, and asserts an internal write signal wrb with respect to the memory core 11 to a high level.

The refresh control circuit 17 makes a refresh operation in the memory core 11 to be executed in accordance with the signal refa. When the signal refa is asserted to a high level and the internal write signal wrb is asserted to a high level, the refresh control circuit 17 takes the signal refa therein. When the signal refa is asserted to a high level and the internal write signal wrb is negated to a low level, the refresh control circuit 17 asserts the signal refb to a high level, and negates the signal refb to a low level after an elapse of a certain period of time. The negation of the signal refb by the refresh control circuit 17 may be performed by providing a delay circuit in the refresh control circuit 17 to make the signal refb to be self-reset, for example.

FIG. 5 is a timing chart illustrating an operation example of the semiconductor memory device in the first embodiment. When writing of data (WR) is requested based on the command signal CMD from the CPU 20, the command decoder 14 asserts the signal pwr, resulting in that the access control circuit 16 asserts the signal wrb, and performs writing with respect to the memory core 11.

At this time, when the voltage Vddi supplied from the boosting circuit 12 is less than the voltage required for the operation of the memory core 11 (1.8 V, in this case), the refresh flag is set in the flag register 15A of the register circuit 15, and the signal refa is asserted, as illustrated in FIG. 5. Since the signal wrb is asserted, the refresh control circuit 17 takes the asserted signal refa therein and holds the signal. As described above, even if the voltage Vddi supplied to the memory core 11 is less than the certain voltage (the voltage required for the operation of the memory core 11), the writing of data with respect to the memory core 11 is conducted.

When the writing of data with respect to the memory core 11 based on the command signal CMD from the CPU 20 is completed, the command decoder 14 negates the signal pwr. When the signal pwr is negated under the state where the signal refa is asserted, the refresh control circuit 17 asserts the signal refb.

Accordingly, the access control circuit 16 asserts the signal wrb, and performs the refresh operation with respect to the memory core 11. Specifically, with respect to the address ada held in the address register 15A of the register circuit 15, internal reading and writing in the memory core 11 are conducted, to thereby perform rewriting of data. After the elapse of a certain period of time (a period of time longer than that taken for the completion of the refresh operation with respect to the memory core 11), the refresh control circuit 17 negates the signal refb, resulting in that the refresh flag in the flag register 15A of the register circuit 15 is reset, and the signal refa is negated.

As described above, the data written under the state where the voltage Vddi supplied to the memory core 11 is less than the certain voltage, is rewritten by the refresh operation in the memory core 11, resulting in that the retention life of data can be secured.

Figure 6:
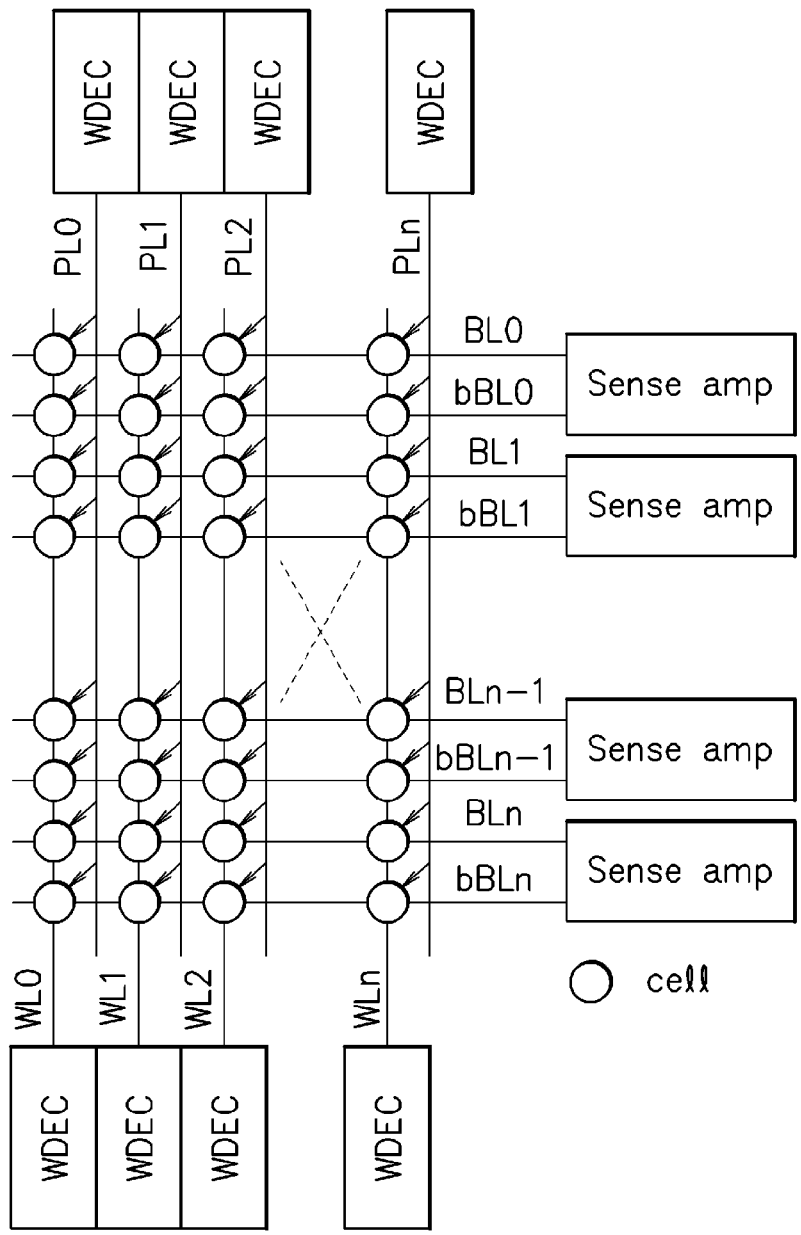
FIG. 6 is a diagram illustrating an example of a memory core in the present embodiment.

Here, FIG. 6 illustrates an outline of a configuration of the memory core 11 when using a memory cell of FeRAM. In FIG. 6, each of word lines WL0 to WLn and plate lines PL0 to PLn is selectively driven by a word line decoder (WDEC), and an electric potential read to each of bit lines BL0 to BLn, and bBL0 to bBLn, is sensed by a sense amplifier (Sense amp).

Figure 7A:
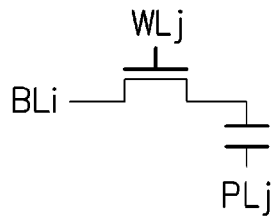
FIG. 7A and FIG. 7B are diagrams for explaining a rewrite operation of a memory in the present embodiment.
Figure 7B:
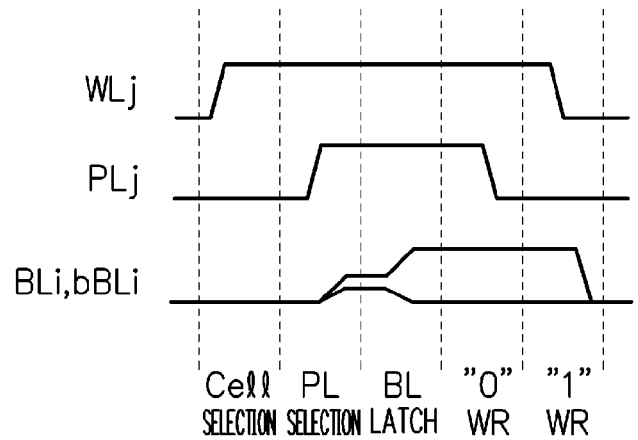

In a memory cell as illustrated in FIG. 7A, an electric potential in accordance with data stored in the memory cell selected by applying a certain electric potential to a word line WLj (j=0 to n) and a plate line PLj by the word line decoder (WDEC), is read to bit lines BLi and bBLi (i=0 to n), as illustrated in FIG. 7B, for example. The electric potential read to the bit lines BLi and bBLi is sensed by the sense amplifier, and after the electric potential of the bit lines BLi and bBLi is amplified, the electric potential of the word line WLj and the plate line PLj is sequentially set to a certain electric potential, thereby performing rewriting with respect to the memory cell. In the manner as described above, the aforementioned refresh operation is conducted. When the configuration of the memory core 11 employs a memory cell of DRAM, it is also possible to realize the refresh operation by performing reading and then rewriting in a similar manner.

Figure 8:
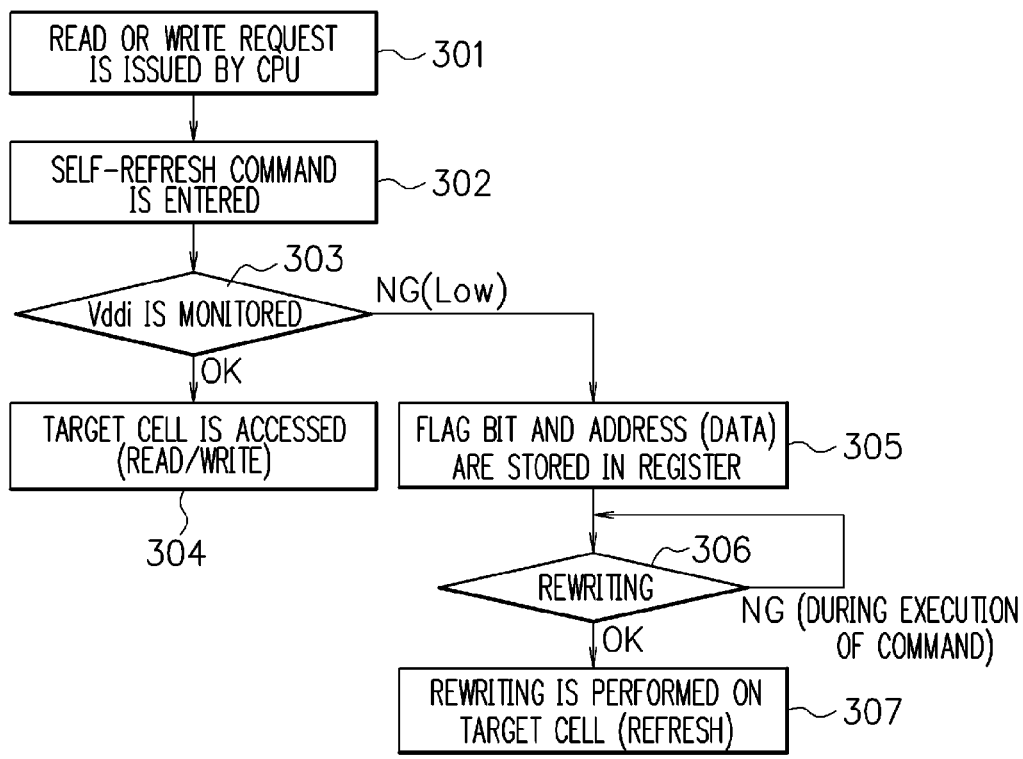
FIG. 8 is a diagram illustrating an example of a rewrite sequence in the present embodiment.

FIG. 8 is a diagram illustrating one example of a rewrite sequence in the present embodiment. Note that FIG. 8 illustrates, as one example, a case where the configuration of the memory core 11 employs a memory cell of DRAM. A request regarding read or write with respect to the memory circuit 10 is issued by the CPU 20 (301), and a self-refresh command is entered (302). The voltage monitoring circuit monitors the supplied power supply voltage Vddi (303), and when the power supply voltage Vddi is not less than the certain voltage, the access with respect to a target memory cell is conducted (304).

On the other hand, when the power supply voltage Vddi is less than the certain voltage, the register circuit sets the reset flag, and holds the address (the register circuit may also hold the data, according to need) (305). After that, it is judged whether or not the rewriting with respect to the address held in the register circuit 15 can be carried out (306), and when it becomes possible to perform the rewriting, the access control circuit carries out the rewriting with respect to the address held in the register circuit 15 (307).

According to the first embodiment, when the writing in the memory core 11 is performed under the state where the supplied power supply voltage Vddi is low, in the memory circuit 10 the flag is set and the address is held, and after the power supply becomes higher than the certain voltage, the refresh operation with respect to the address is conducted. Accordingly, even if the power supply voltage supplied to the memory circuit is lowered, it becomes possible to increase the speed of operation while securing the retention life of memory data, and it is possible to reduce the power consumption without lowering the processing capability. In the present embodiment, by making the refresh operation to be included in a command cycle so that an operation cycle based on the external command and an operation cycle related to the refresh operation are included in a period of one time of memory core operation, when the aforementioned refresh operation occurs, the refresh operation can be securely realized.

Second Embodiment

Next, a second embodiment will be described.

In the first embodiment, although the refresh operation of performing the rewriting of data is set to be included in one command cycle, a period of time of performing the refresh operation is constantly included in the command cycle, so that one command cycle becomes long, which causes the reduction in the processing capability. Accordingly, in the second embodiment to be described hereinafter, it is designed such that the control to make the period of time of performing the refresh operation to be constantly included in the command cycle is not performed, and the access with respect to the memory circuit is made to wait when performing the refresh operation.

Figure 9:
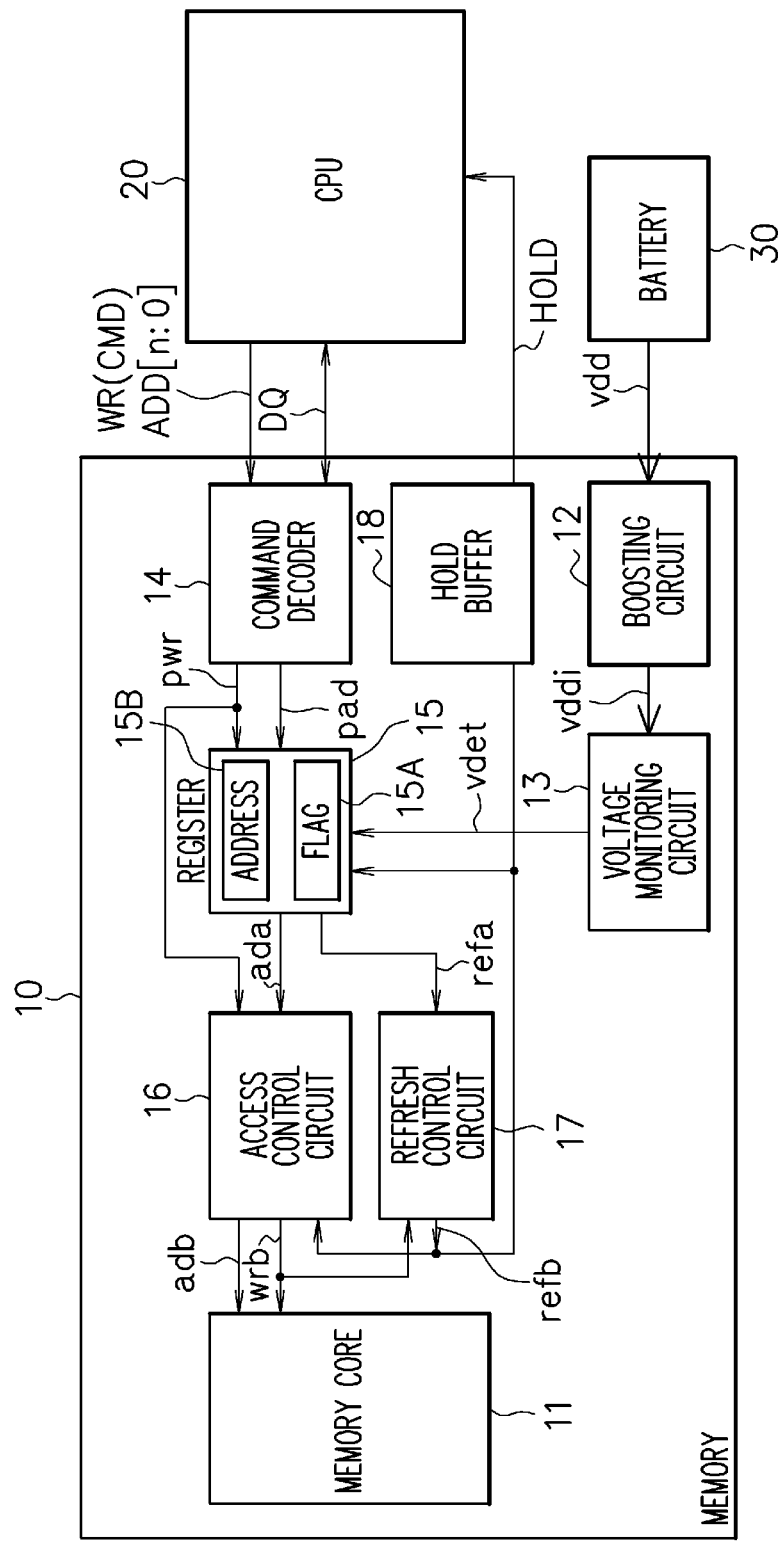
FIG. 9 is a diagram illustrating a configuration example of a semiconductor memory device in a second embodiment.

FIG. 9 is a diagram illustrating a configuration example of a semiconductor memory device according to the second embodiment. In FIG. 9, components and the like having the same functions as those of the components and the like illustrated in FIG. 1 are denoted by the same reference numerals, and overlapped explanation thereof will be omitted. The memory circuit 10 as the semiconductor memory device in the second embodiment includes a hold buffer 18, in addition to the memory core 11, the boosting circuit 12, the voltage monitoring circuit 13, the command decoder 14, the register circuit 15, the access control circuit 16, and the refresh control circuit 17.

The hold buffer 18 receives the signal refb output from the refresh control circuit 17. When the signal refb is asserted to a high level, the hold buffer 18 asserts a signal HOLD to be output and makes the access from the outside with respect to the memory circuit 10 wait. When the signal refb is negated to a low level, the hold buffer 18 negates the signal HOLD.

Figure 10:
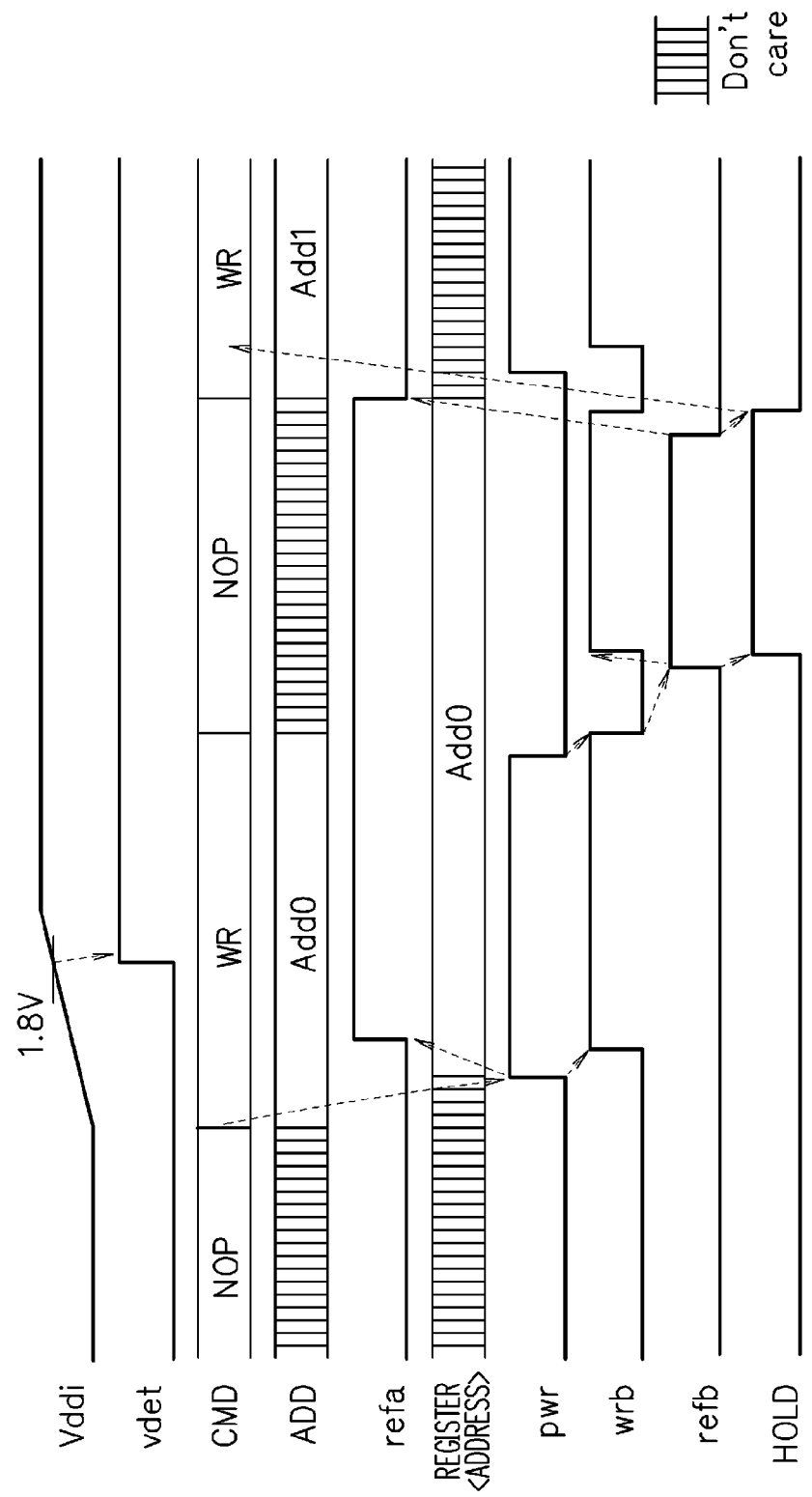
FIG. 10 is a timing chart illustrating an operation example of the semiconductor memory device in the second embodiment.
Figure 11A:
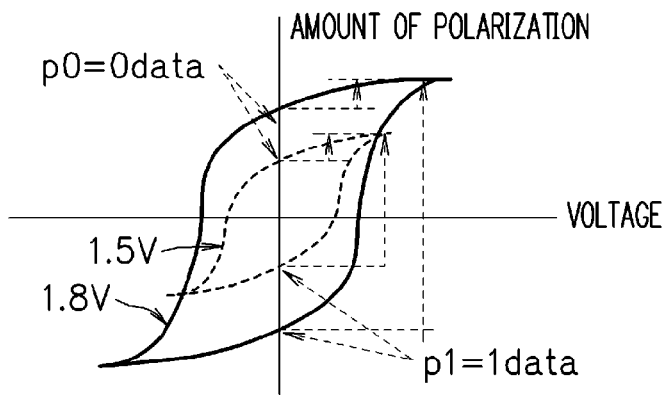
FIG. 11A and FIG. 11B are diagrams for explaining an operation margin in a memory cell.
Figure 11B:
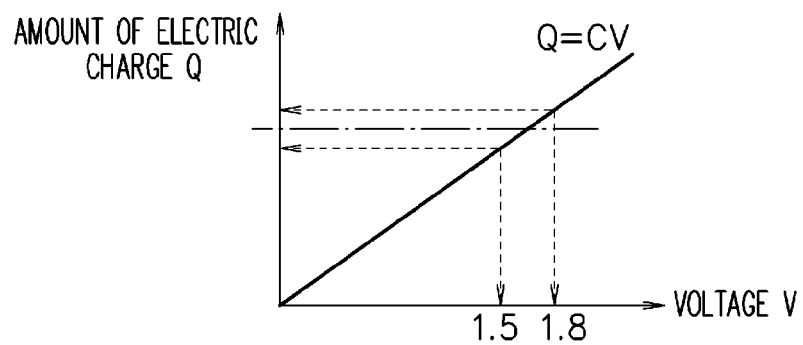

FIG. 10 is a timing chart illustrating an operation example of the semiconductor memory device in the second embodiment. The signal HOLD output from the hold buffer 18 is controlled in accordance with the signal refb output from the refresh control circuit 17. Specifically, when the signal refb output from the refresh control circuit 17 is asserted, the signal HOLD output from the hold buffer 18 is asserted, and when the signal refb output from the refresh control circuit 17 is negated, the signal HOLD output from the hold buffer 18 is negated.

According to the second embodiment, even if the power supply voltage supplied to the memory circuit is lowered, it becomes possible to increase the speed of operation while securing the retention life of memory data, and it is possible to reduce the power consumption without lowering the processing capability, similar to the first embodiment. Further, when the refresh operation is performed when the writing in the memory core 11 is conducted under the state where the supplied power supply voltage Vddi is low, by outputting the signal HOLD to make the access from the outside wait, it is possible to shorten the command cycle, resulting in that the processing capability can be improved.

In the above-described first embodiment and second embodiment, the boosting circuit 12 is designed to be provided in the memory circuit 10, but, it is also possible to design such that the boosting circuit is provided on the outside of the memory circuit 10.

Note that the above-described embodiments merely illustrate concrete examples of implementing the present embodiments, and the technical scope of the present embodiments is not to be construed in a restrictive manner by these embodiments. That is, the present embodiments may be implemented in various forms without departing from the technical spirit or main features thereof.

When the writing of data is conducted under the state where the supplied voltage is low, the disclosed semiconductor memory device sets the flag, holds the address, and performs the refresh operation. Accordingly, even if the supplied voltage is lowered, it becomes possible to increase the speed of operation while securing the retention life of memory data, and to reduce the power consumption without lowering the processing capability.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor memory device, comprising:
   a voltage monitoring circuit which monitors a supplied voltage;
   a memory core which includes a plurality of memory cells and includes a refresh function;
   a register circuit in which a flag is set when the voltage monitoring circuit detects that the supplied voltage is in a state of being less than a certain voltage at a time of performing writing of data with respect to a memory cell of the plurality of the memory cells, and which holds an address at which the writing is performed; and
   a control circuit which makes, in accordance with the flag set in the register circuit, the memory core execute rewriting by a refresh operation with respect to the address held in the register circuit.

2. The semiconductor memory device according to claim 1, wherein
   the control circuit makes the rewriting by the refresh operation to be executed in accordance with the flag set in the register circuit, and then resets the flag set in the register circuit.

3. The semiconductor memory device according to claim 2, wherein
   a period related to the rewriting by the refresh operation in accordance with the flag set in the register circuit is included in a write cycle of data with respect to the memory cell.

4. The semiconductor memory device according to claim 2, wherein
   when the flag is set in the register circuit, a signal which makes an access with respect to the memory core wait is output.

5. The semiconductor memory device according to claim 1, wherein
   a period related to the rewriting by the refresh operation in accordance with the flag set in the register circuit is included in a write cycle of data with respect to the memory cell.

6. The semiconductor memory device according to claim 1, wherein
   when the flag is set in the register circuit, a signal which makes an access with respect to the memory core wait is output.

7. The semiconductor memory device according to claim 1, wherein
   the memory cell includes a capacitor, and the capacitor is a ferroelectric capacitor.

8. A control method of a semiconductor memory device, comprising:
   monitoring, by using a voltage monitoring circuit, a voltage supplied to a memory core including a plurality of memory cells and including a refresh function;
   setting a flag in a register circuit when it is detected that the supplied voltage is in a state of being less than a certain voltage at a time of performing writing of data with respect to a memory cell of the plurality of the memory cells, and holding an address at which the writing is performed; and
   making, in accordance with the flag set in the register circuit, the memory core execute rewriting by a refresh operation with respect to the address held in the register circuit.

* * * * *